(12) United States Patent
Dey

(10) Patent No.: US 10,778,189 B1
(45) Date of Patent: Sep. 15, 2020

(54) SOURCE FOLLOWER-BASED SALLEN-KEY ARCHITECTURE

(71) Applicant: Analog Devices, Inc., Norwood, MA (US)

(72) Inventor: Aritra Dey, Raleigh, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/562,854

(22) Filed: Sep. 6, 2019

(51) Int. Cl.
*H03H 11/12* (2006.01)
*H03G 1/00* (2006.01)
*H03G 3/30* (2006.01)

(52) U.S. Cl.
CPC ....... *H03H 11/1286* (2013.01); *H03G 1/0029* (2013.01); *H03G 3/30* (2013.01); *H03H 11/1213* (2013.01)

(58) Field of Classification Search
CPC .......... H03H 11/1286; H03H 11/1213; G03G 1/0029; H03G 3/30
See application file for complete search history.

(56) References Cited

U.S. PATENT DOCUMENTS

| | | | |
|---|---|---|---|
| 6,608,516 B1 * | 8/2003 | Lennous | G06G 7/186 327/336 |
| 7,417,500 B2 * | 8/2008 | Arnott | H03F 1/34 330/282 |
| 7,471,140 B2 * | 12/2008 | Salerno | H03H 11/1213 327/551 |
| 7,912,669 B2 * | 3/2011 | Basu | G06F 11/24 702/117 |
| 8,368,461 B2 * | 2/2013 | Blanc | H03H 11/12 327/552 |
| 8,803,596 B2 | 8/2014 | Soe | |
| 9,614,496 B1 | 4/2017 | Cowles | |

OTHER PUBLICATIONS

Resta et al., *An Improved Source-Follower Based Sallen-Key Continuous Time Biquadratic Cell with Auxiliary Path*, IEEE Norchip, Oct. 2014, 4 pages.
Lee et al., *A 50-450 MHz Tunable RF Biquad Filter Based on a Wideband Source Follower with >26dBm IIP3, +12dBm P1dB and 15 db Noise Figure*, IEEE Journal of Solid-State Circuits, vol. 50, No. 10, Oct. 2015, 12 pages.

* cited by examiner

*Primary Examiner* — Dinh T Le
(74) *Attorney, Agent, or Firm* — Patent Capital Group

(57) ABSTRACT

Systems and methods for improving source-follower-based Sallen-Key architectures are disclosed. In particular, systems and methods for circumventing the non-idealities associated with source-follower-based Sallen-Key biquad filters when used in either baseband signal or radiofrequency paths. The systems and methods disclosed herein present power-efficient, cost-efficient solutions that can be implemented in a reduced area of a circuit.

20 Claims, 7 Drawing Sheets

SOURCE FOLLOWER-BASED SALLEN-KEY ARCHITECTURE

FIELD OF THE DISCLOSURE

The present invention relates to the field of circuit architectures, and in particular Sallen-Key architectures.

BACKGROUND

The Sallen-Key architecture is also known as a voltage control voltage source (VCVS) architecture. It is one of the most widely used filter topologies in circuit designs. The Sallen-Key architecture is a filter architecture designed to provide flat gain response in the pass band. Source-follower-based Sallen-Key filters are widely used in baseband architectures and radiofrequency (RF) architectures. A typical example is the use of a biquad source-follower-based Sallen-Key filter in a transmit baseband path for DAC (digital-to-analog conversion) image rejection. A source follower-based Sallen-Key architecture provides lower distortion, wider bandwidth and lower power compared to an operational amplifier-based buffer.

A source follower, also known as a common drain amplifier, is a circuit configuration used in circuit designs to provide a voltage buffer or to transform impedances. In general, a source follower circuit provides high input impedance, low output impedance, and a voltage buffer. A Sallen-Key architecture is a second-order active filter, and its external filter characteristics include a finite input impedance and a small output impedance. Sallen-Key filters can be designed as a low-pass, band-pass, or high-pass filters. A higher filter order can be achieved by cascading two or more Sallen-Key circuits.

SUMMARY OF THE DISCLOSURE

Systems and methods for improving source-follower-based Sallen-Key architectures are disclosed. In particular, the present disclosure describes systems and methods for circumventing the non-idealities associated with source-follower-based Sallen-Key biquad filters when used in either baseband signal or radiofrequency paths. The systems and methods disclosed herein present power-efficient, cost-efficient solutions that can be implemented in a reduced area of a circuit.

According to one aspect, a voltage-controlled, voltage source-based filter for providing a flat passband gain response comprises a voltage source configured to provide input voltage, a first resistor and a second resistor connected in series, wherein the first resistor is connected to the voltage source and a first side of the second resistor, a gain stage connected to a second side of the second resistor, and an output configured to provide output voltage. The gain stage is configured to introduce a gain to a feedback path voltage, and the gain increases feedback of a feedback path.

According to some implementations, the gain stage comprises a transistor. In some examples, the transistor is a p-channel metal oxide semiconductor transistor. In some implementations, the gain stage further comprises a second transistor. In some examples, the second transistor is a p-channel metal oxide semiconductor transistor. In other examples, the second transistor is an n-channel metal oxide semiconductor transistor. According to some implementations, the voltage-controlled, voltage source-based filter further comprises a third resistor, connected to the transistor drain. In other implementations, the voltage-controlled, voltage source-based filter further comprises a third transistor connected to the transistor drain.

According to some implementations, the voltage-controlled, voltage source-based filter further comprises a buffer configured to buffer the feedback path voltage. In various examples, the buffer is one of a source follower and a transistor. In some examples, the buffer is one of a PMOS transistor and an NMOS transistor. In various examples, the buffer is an amplifier. In some examples, the buffer is one of a unity gain amplifier and an operational amplifier. According to some implementations, the gain stage operates as a buffer in the feedback path.

According to some implementations, the voltage-controlled, voltage source-based filter further comprises a first capacitor connected to the input of the gain stage and a second capacitor after the output of the gain stage. In various implementations, the first capacitor has a first capacitance, and the second capacitor has a second capacitance, and a ratio of the first capacitance to the second capacitance is about one or less than one. According to some implementations, the first capacitor and the second resistor comprise a first order filter, and an output of the first order filter is input to the gain stage.

According to some implementations, the output is an output line from an input of the gain stage, wherein the output line provides the output voltage.

According to various implementations, the gain of gain stage is about 1.5 or less than about 1.5. According to various examples, the gain of the voltage-controlled, voltage source-based filter is about 1 or less than 1.

According to another aspect, a method for providing a flat gain response in a voltage-controlled, voltage source filter, comprises providing an input voltage at a voltage source, filtering the input voltage at a second resistor and a first capacitor, and outputting a filtered signal, providing second order filtering of the filtered signal at a gain stage and a second capacitor, providing a buffer between the gain stage and the second capacitor; and outputting a filtered output voltage from an input of the gain stage. The gain stage increases gain of the filtered signal.

According to some implementations, the method further comprises providing a first resistor, wherein the first resistor is connected to the voltage source and the second resistor.

According to some implementations, the second resistor and the first capacitor comprise a first order filter, and the gain stage and the second capacitor are connected between the first order filter and a connection point between the first and second resistors.

According to some implementations, providing the buffer comprises buffering a gain stage output at a source follower.

According to another aspect, a voltage-controlled, voltage source-based filter for providing a flat passband gain response, comprises a voltage source configured to provide input voltage, a first resistor connected to the voltage source; a first order filter including a second resistor and a first capacitor, wherein the second resistor is connected to the first resistor, and wherein the first order filter outputs a filtered signal, means for introducing a gain to the filtered signal; and an output configured to provide a filtered output voltage.

According to some examples, the means for introducing the gain changes a power consumption of the filter to between around 5 mW and around 6 mW.

According to some implementations, the means for introducing the gain includes a gain stage, and the gain stage is further connected to a second capacitor. In some implementations, the means for introducing the gain includes a transistor. In some examples, the transistor is a p-channel metal oxide semiconductor transistor. In some examples, the means for introducing the gain introduces a gain of about 1.5 or less than 1.5.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Systems and methods are provided for circumventing the non-idealities associated with typical source-follower-based Sallen-Key filter when used in either baseband or radiofrequency (RF) path. Sallen-Key filters are used in numerous types of circuits. According to some examples, Sallen-Key filters are used in transmitters and transceivers. The source-follower-based Sallen-Key filter designs provided herein are power-efficient and cost-efficient. Additionally, the source-follower-based Sallen-Key filter designs provided herein are smaller than current source-follower-based Sallen-Key filter designs and decrease the area of the Sallen-Key filter. In various implementations, the source-follower-based Sallen-Key filter design is a biquadratic filter (or biquad filter).

Sallen-Key filters can be designed in multiple ways. One common Sallen-Key architecture uses an operational amplifier. Another Sallen-Key architecture uses a common-drain amplifier, also known as a source-follower. The a common-drain amplifier is used as a voltage buffer. In general, the gate terminal of common-drain amplifier is the input, the source is the output, and the drain is common to both the input and the output. In some examples, a common-drain amplifier, or source-follower, is used to transform impedance.

A biquadratic filter is a type of linear filter that implements a transfer function that is the ratio of two quadratic functions. Two types of biquadratic filters include a single-amplifier biquad filter and a two-integrator-loop filter. The single-amplifier biquad topology uses feedback to generate complex poles, and, in some cases, complex zeros. The feedback in the single-amplifier biquad filter is used to move the real poles of an RC circuit to generate desired or proper filter characteristics. The two-integrator-loop topology is derived from rearranging a biquadratic transfer function to reveal a state variable filter structure. Depending on the output state used, any kind of second-order filter can be implemented using a two-integrator-loop topology.

Source-follower-based Sallen-Key biquad filters are widely used in both baseband and radiofrequency architectures. A typical example is the use of the Sallen-Key biquadratic filter in the transmit baseband path for digital-to-analog conversion (DAC) image rejection. According to various implementations, a source follower-based architecture provides lower distortion and wider bandwidth compared to an operational-amplifier-based architecture. Additionally, a source follower-based architecture consumes significantly less power than an operational-amplifier-based architecture.

Figure 1:
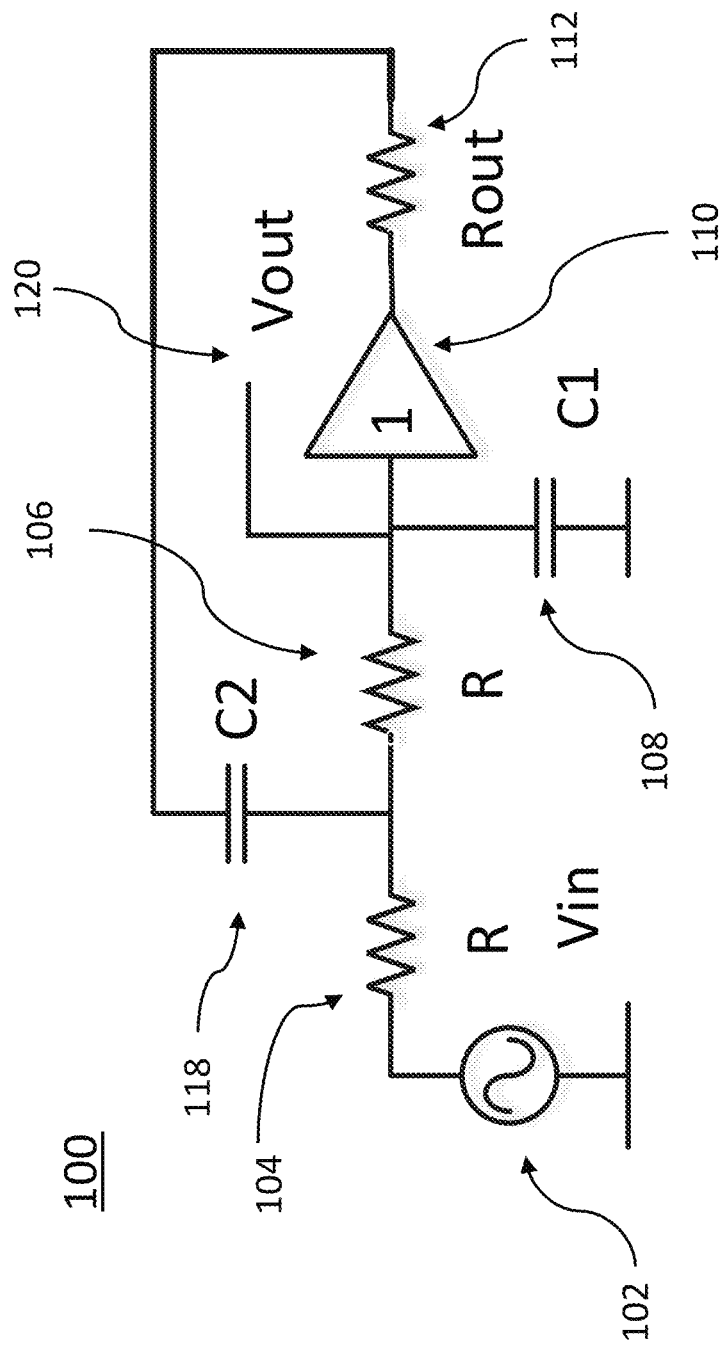
FIG. 1 is a diagram illustrating a Sallen-Key biquadratic filter, according to some embodiments of the disclosure.

FIG. 1 shows a Sallen-Key based biquadratic filter 100, according to some embodiments of the disclosure. The filter 100 includes an AC voltage source $V_{in}$ 102, a first resistor 104, a second resistor 106, a first capacitor 108, a second capacitor 118, a source follower 110, a third resistor $R_{out}$ 112, and an output voltage $V_{out}$ 120. $R_{out}$ represents the impedance looking into the source follower 110. The source follower 110 acts as a voltage buffer and is also referred to herein as a buffer. The Sallen-Key filter shown in FIG. 1 has a finite $R_{out}$ 112. The $R_{out}$ 112 causes the filter 100 to deviate. In particular, when the filter 100 has a high bandwidth, the $R_{out}$ 112 can drastically impact the filter 100.

In some implementations, the Sallen-Key filter 100 attempts to mimic a second-order Butterworth filter. The Butterworth filter is a type of signal processing filter designed to have a frequency response as flat as possible in the passband. In various examples, a Butterworth filter is a maximally flat magnitude filter. According to some implementations, the Sallen-Key filter 100 mimics a second-order Butterworth filter, and the Sallen-Key filter 100 has a 2-to-1 ratio of second capacitance C2 at second capacitor 118 to first capacitance C1 at first capacitor 108.

According to various implementations, systems and methods are provided for achieving a 1-to-1 ratio of second capacitance C2 at second capacitor 118 to first capacitance C1 at first capacitor 108 and to have the same transfer function, which reduces the amount of area that the second capacitor 118 occupies. In particular, the $R_{out}$ 112 is determined by the output impedance of the buffer. The simplest buffer is a source follower 110.

The $R_{out}$ 112 in FIG. 1 denotes the output impedance of the source follower 110. One problem with the filter 100 of FIG. 1 is that the output of the filter 100 is taken from the source follower 110. The output from the source follower 110 has conjugate zeros that severely degrade the stop band filter rejection, as shown in Equation (1):

$$V_{out} = V_{in} \frac{1 + sC_2 R_{out} + s^2 C_1 C_2 R R_{out}}{\{s^2 C_1 C_2 (R^2 + 2RR_{out}) + s(2RC_1 + C_2 R_{out}) + 1\}} \quad (1)$$

In other implementations, the filter 100 can take the output from the input of the buffer, the source follower 110, instead. The input of the source follower 110 has less degradation. In particular, degradation at the input has a simple left half plane zero as shown in Equation (2):

$$V_{out} = V_{in} \frac{(1 + sC_2 R_{out})}{\{s^2 C_1 C_2 (R^2 + 2RR_{out}) + s(2RC_1 + C_2 R_{out}) + 1\}} \quad (2)$$

As seen from Equation (1) and Equation (2), a quality factor Q is also degraded by $R_{out}$ 112 of the source follower 110. A degradation of the quality factor Q is detrimental when the goal is near ideal biquadratic transfer function in the passband, because the degradation of Q also reduces roll-off in the stopband. The parasitic zero reduces the stopband roll-off further, increasing the difficulty in meeting the requirements of both in-band and out-of-band emission of the transmit (TX) chain, for a single-band or a multiband implementation. This problem is generally worse when using low resistance values. This type of situation arises, for example, when using the Sallen-Key filter for radiofrequency (RF) frequencies. This type of situation also arises, for example, in noisy environments, such as when noise is a concern to meet a desired signal-to-noise ratio (SNR) at a low signal swing through the filter. In some instances, a low signal swing may be used to reduce distortion of a subsequent up-conversion mixer in the TX baseband chain.

Generally, to alleviate the problem of the resistance $R_{out}$ from the source follower 110, traditional systems and methods focus on reducing the $R_{out}$ by increasing the transconductance ($g_m$) of the source follower 110 using feedback. Some techniques to increase the transconductance ($g_m$) using feedback include using a super source follower and/or a flipped source follower. Increasing the transconductance ($g_m$) reduces the impedance. Such a feedback-induced scheme of super source follower or flipped source follower is only feasible when the common mode voltage at the gate of the source follower is high enough, and/or we have a sufficiently high voltage supply. However, in many examples, the common mode voltage at the gate of the source follower is not high, and/or the voltage supply is too low. In one example, the filter 100 follows a current steering DAC (digital-to-analog converter) which has a low common mode output voltage to ensure linearity. In another example, the filter 100 is supplied off a low voltage supply (<1V). Furthermore, active devices add thermal noise. In general, noise of 1/f is not problematic as the capacitance $C_2$ of the second capacitor 118 is generally open at low frequencies and thus the noise does not propagate to the output of the filter 100.

In some techniques to address the problem of a high resistance $R_{out}$ from the source follower 110, current is increased, thereby increasing the size of the filter 100, such that the transconductance ($g_m$) of the source follower 110 decreases. However, the increased current increases the power requirements of the circuit, and additionally the size of the source follower 110 is increased, increasing the area of the circuit.

Figure 2:
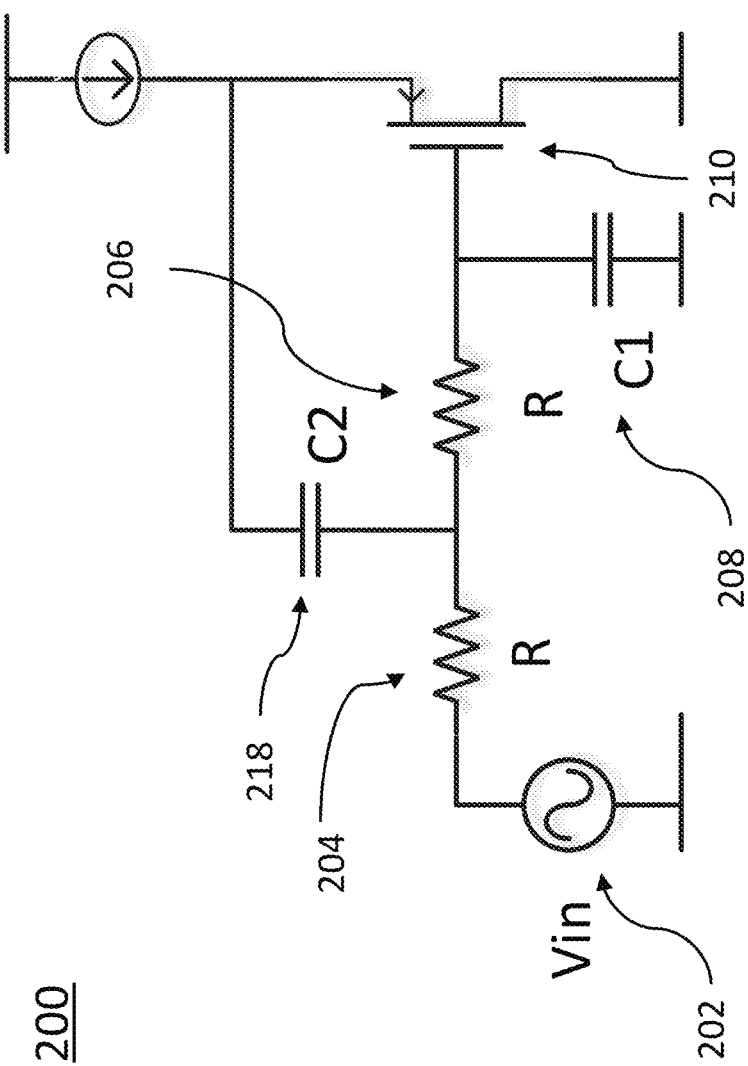
FIG. 2 is a diagram illustrating another Sallen-Key biquadratic filter, according to some embodiments of the disclosure.

FIG. 2 shows a Sallen-Key based biquadratic filter 200 using a transistor 210 instead of a source follower 110, according to some embodiments of the disclosure. In particular, the filter 200 includes an AC voltage source $V_{in}$ 202, a first resistor 204, a second resistor 206, a first capacitor 208, a second capacitor 218, and a transistor 210. According to various implementations, the transistor 210 is a field effect transistor. In one example, the transistor 210 is a Metal Oxide Semiconductor Field Effect Transistor (MOSFET). According to various implementations, the Sallen-Key based filter 200 functions similarly to the Sallen-Key based filter 100 of FIG. 1.

According to various implementations, any $R_{out}$ from the third resistor 112 decreases the amount of feedback, and therefore the feedback is not as effective in creating a pair of conjugate poles and rendering a second order Butterworth filter. In general, reducing the feedback reduces the Q of the filter. Increasing the capacitance $C_2$ of the second capacitor 118 increases the feedback and increases Q. However, increasing the capacitance $C_2$ of the second capacitor 118 also moves the parasitic zero to a lower frequency. Thus, the solution of increasing the capacitance $C_2$ of the second capacitor 118 increases area of the capacitor and thereby increases the area of the filter.

Figure 3A:
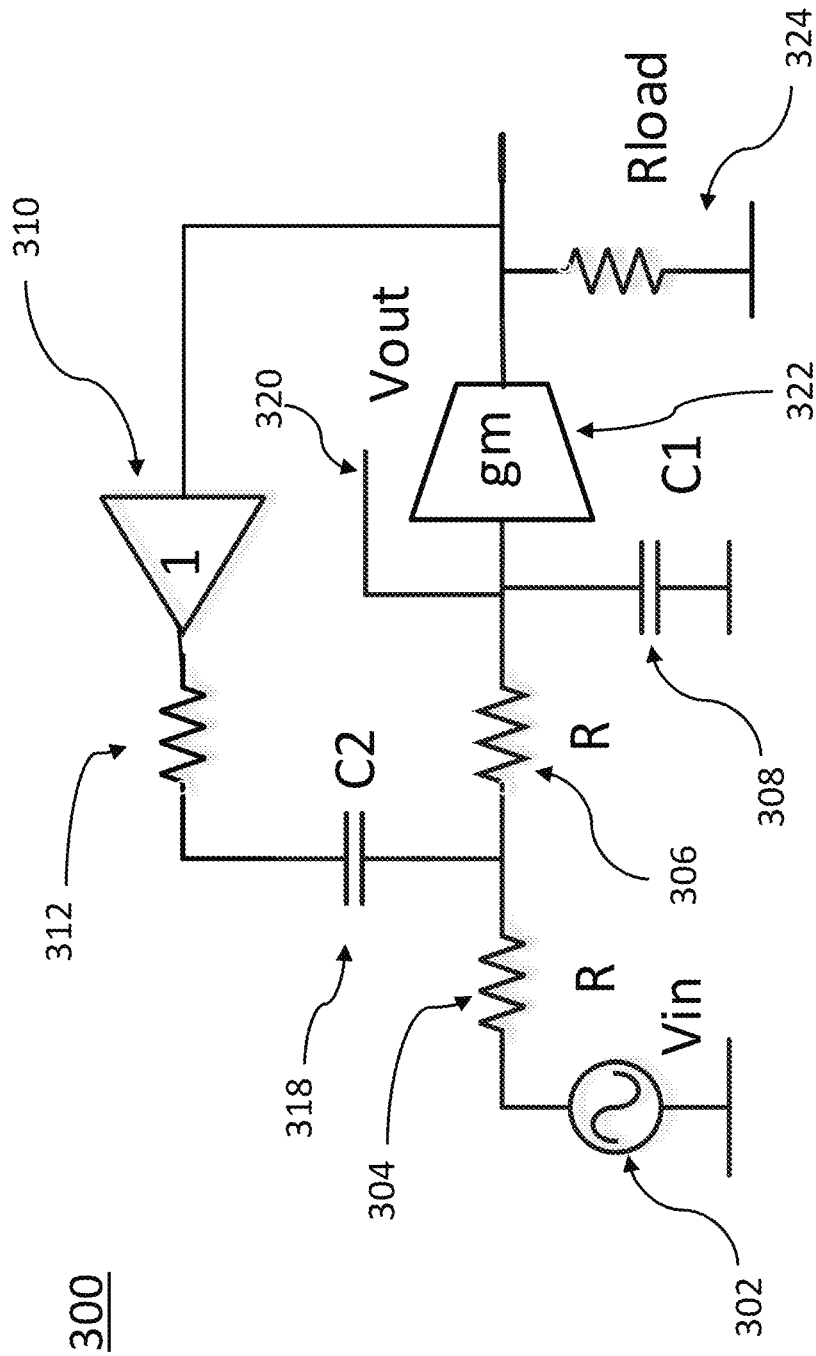
FIGS. 3A-3B are diagrams illustrating Sallen-Key filters including a gain stage, according to some embodiments of the disclosure.

FIG. 3A shows a Sallen-Key based filter 300, according to some embodiments of the disclosure. The filter 300 in FIG. 3A includes an AC voltage source 302, a first resistor 304, a second resistor 306, a first capacitor 308, a second capacitor 318, a source follower 310, a third resistor $R_{out}$ 312, an output voltage $V_{out}$ 320, a gain stage 322, and a fourth resistor $R_{load}$ 324. The gain stage 322 has a transconductance $g_m$. The gain stage 322 and the fourth resistor $R_{load}$ 324 introduce a gain A in the feedback path. In particular, the gain stage 322 is placed between the second resistor 306 (and the first capacitor 308) and the source follower 310. The gain stage 322 enhances the feedback. According to various examples, the gain stage 322 is a small, low-power gain stage, with a gain less than about 1.5.

Referring to FIG. 3A, the addition of the extra gain stage 322 increases the feedback and hence acts to counter the effect of the resistance $R_{out}$ of the third resistor 312. Furthermore, the ratio of the second capacitance $C_2$ of the second capacitor 318 to the first capacitance $C_1$ of the first capacitor 308 can be lowered, i.e., a lower $C_2/C_1$ ratio (as compared to a 2-to-1 ratio), to achieve a quality factor Q of 0.707, by selecting an appropriate gain A. In some implementations, by selecting an appropriate gain A ($=g_m*R_{load}$), the $C_2/C_1$ ratio can be lowered to one. In some implementations, by selecting an appropriate gain A ($=g_m*R_{load}$), the $C_2/C_1$ ratio can be lowered to less than one. According to various features, lowering the $C_2/C_1$ ratio as described results in large savings in terms of area (i.e., lowering the $C_2/C_1$ ratio decreases the area of the circuit). Additionally, according to some implementations, lowering the $C_2/C_1$ ratio as described above also helps move the parasitic zero to a high frequency. In some implementations, the area savings can be large for narrow-band filters with a stringent SNR value. In particular, to achieve a high SNR value, the resistors have lower R values and hence a higher $R_{out}/R$ ratio and higher capacitor values. Similarly, to achieve low distortion when driving non-linear capacitors, the resistors have lower R values and hence a higher $R_{out}/R$ ratio and higher capacitor values. Other solutions to achieving a higher signal-to-noise ratio include larger capacitors which consume extra area on the circuit. Equation (3) shows the transfer function $V_{out}$ with arbitrary m=$C_2/C_1$ and $\alpha$=$R_{out}/R$ ratio and with gain A (from the $g_m$ stage) incorporated:

$$V_{out} = V_{in} \frac{1 + s(mC_1/g_m)}{\{s^2 R^2 C_1^2 (2m\alpha + m) + sRC_1(2 + m + m\alpha - \text{mA}) + 1\}} \quad (3)$$

Equation (3) reverts back to equation (2) with the following substitutions: $mC_1=C_2$, A=1 and $\alpha=R_{out}/R$. Equation (3) gives a general transfer function with arbitrary ratios and A.

According to various features, from equation (3), a gain A of 1.5 is enough to compensate for a low m ratio of about 1 and a high a ratio of about 0.5. Thus, using the filter architecture shown in FIG. 3A, there is an area savings and also a power savings because the source follower 310 is low power without using feedback and without burning power to decrease the $R_{out}$ of the source follower 310. Because the amount gain used is minimal (e.g., 1.4-1.5), the gain stage 322 can be implemented as a low power block. Distortion from the gain stage 322 within the filter bandwidth is minimal, and is reduced in the second capacitor 318 since the band $C_2$ is generally open. Distortion requirements are easily met by implementing a moderate $g_m/1$ ratio and since the gain stage 322 power usage is small, minimal power is consumed. In various examples, the amount of power consumed by the filter 300 is about 3 mW, about 4 mW, about 5 mW, or about 6 mW. For comparison, other Sallen-Key filters use greater than 10 mW to achieve similar performance.

According to some implementations, the filter 300 is configured with a different type of buffer in place of the source follower 310. In one example, the filter 300 is designed with a transistor in place of the source follower 310. The transistor acts as a buffer. The transistor can be one of a PMOS transistor and an NMOS transistor. The type of transistor used in the filter 300 may depend on the voltage levels of the filter 300. In other examples, the filter 300 is configured with an amplifier in place of the source follower 310. The amplifier can be one of a unity gain amplifier and an operational amplifier. The amplifier acts as a buffer.

Figure 3B:
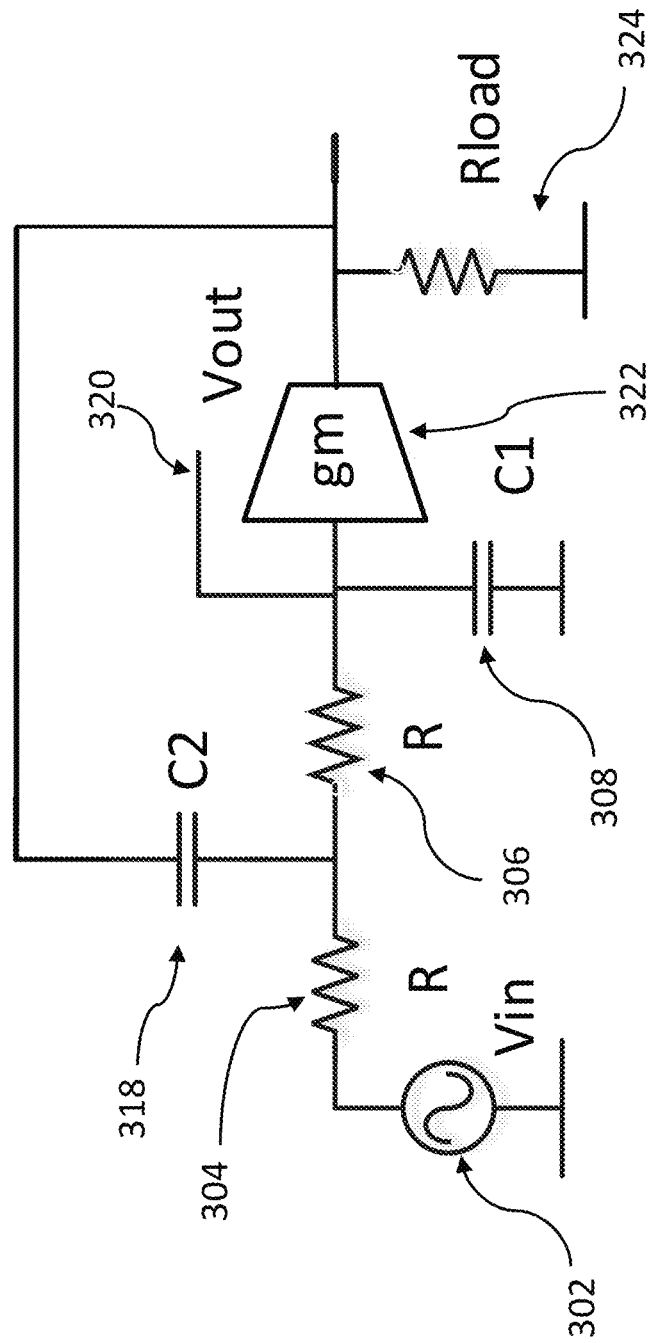

FIG. 3B is an alternative Sallen-Key based filter 350, according to some embodiments of the disclosure. The filter 350 in FIG. 3B is similar to the filter 300 of FIG. 3A, but does not include a source follower 310. The filter 350 includes an AC voltage source $V_{in}$ 302, a first resistor 304, a second resistor 306, a first capacitor 308, a second capacitor 318, an output voltage $V_{out}$ 320, a gain stage 322 having transconductance $g_m$, and a fourth resistor $R_{load}$ 324. The gain stage 322 with the fourth resistor $R_{load}$ 324 introduces a gain A in the feedback path. In particular, the gain stage 322 is placed between the second resistor 306 (and the first capacitor 308) and the second capacitor 318 on the other side of the gain stage 322.

In the filter 350 of FIG. 3B, the gain stage 322 operates as a buffer as well as a gain stage. According to various implementations, as long as the resistance Road of the fourth resistor 324 is relatively small, the gain stage 322 can operate as a buffer. In one example, the resistance $R_{load}$ of the fourth resistor 324 has a value similar to the resistance $R_{out}$ of the third resistor 312 of FIG. 3A. In one example, without the source follower 310, the gain stage 322 of FIG. 3B burns more power than the gain stage 322 of FIG. 3A to achieve the same gain with a low resistance $R_{load}$ 324. According to various features, since the filter 350 of FIG. 3B does not include a voltage buffer (source follower 310), the resistance $R_{load}$ of the fourth resistor 324 is exposed to the second capacitor 318, which can result in a low frequency zero. The resistance Road of the fourth resistor 324 is reduced to prevent the low frequency zero. For reduction of the resistance $R_{load}$ of the fourth resistor 324, the transconductance $g_m$ of the gain stage 322 is increased, which increases the power consumption of the filter 350 for the same gain as filter 300.

According to various implementations, the resistance value R of the first 304 and second 306 resistors is small. In various examples, the resistance of the first 304 and second 306 resistors is less than about 25 Ohms, about 25 Ohms, about 28 Ohms, about 29 Ohms, about 30 Ohms, or about 32 Ohms. Small resistance values reduce the thermal noise floor. Note that when a source follower 310 is not used, and the gain stage 322 has a higher transconductance value $g_m$, and the fourth resistor 324 has a low resistance value Road, more power is consumed in the gain stage 322. In one example, the gain is about 1.5, the resistance $R_{load}$ of the fourth resistor 324 is about 50 Ohm, and the transconductance $g_m$ of the gain stage 322 is 1.5/50. According to one example, when the gain stage 322 has a high value $g_m$, more current is consumed at the gain stage 322. When the source follower 310 is included, the resistance $R_{load}$ of the fourth resistor 324 can be higher and less power is consumed by the filter.

Figure 4:
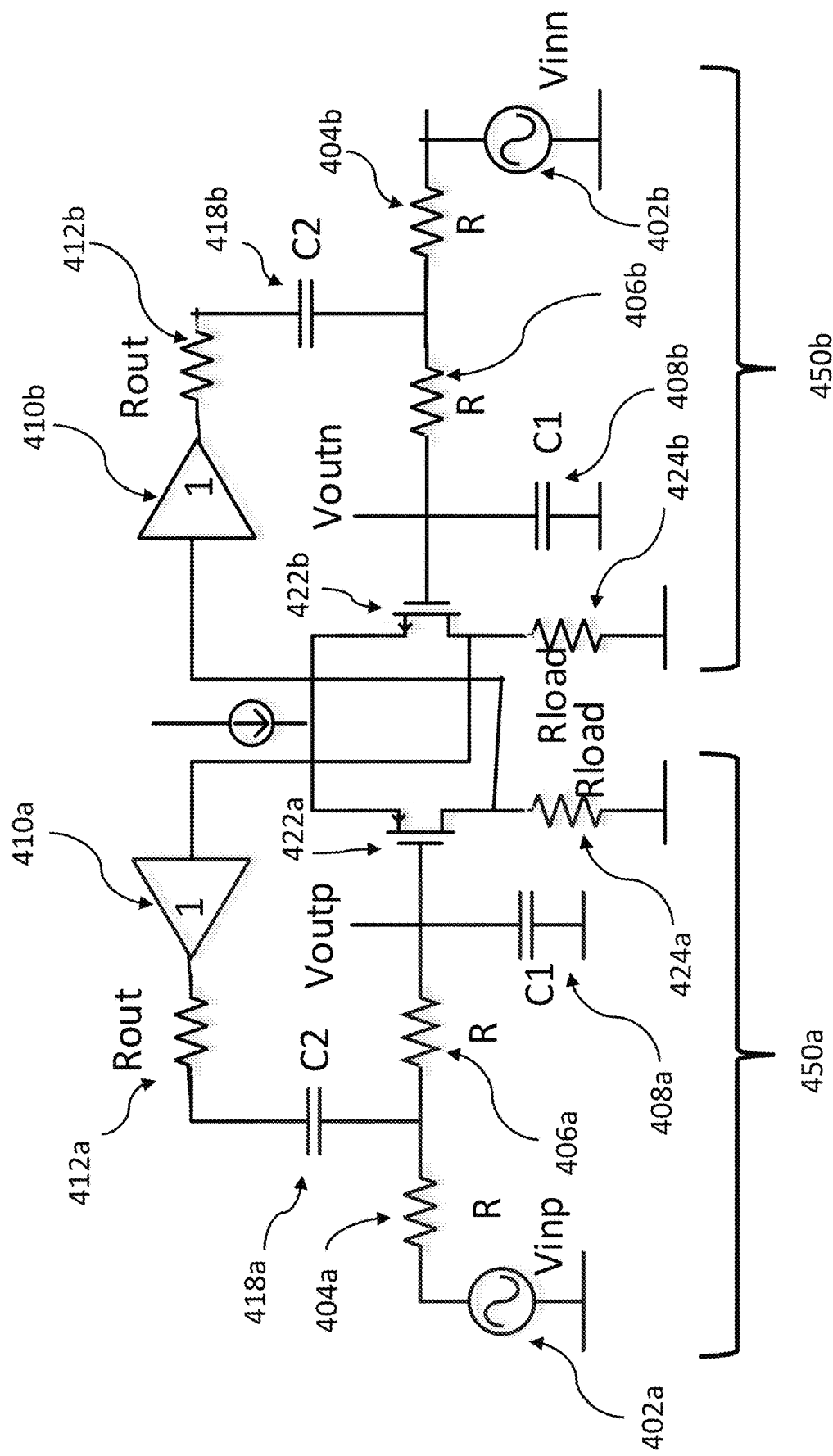
FIG. 4 is a diagram illustrating a gain stage of a Sallen-Key filter, according to some embodiments of the disclosure.

FIG. 4 is a diagram illustrating a gain stage in a Sallen-Key filter 400, according to some embodiments of the disclosure. In particular, FIG. 4 shows first 450a and second 450b integrated Sallen-Key filters sharing a gain stage architecture including first 422a and second 422b transistors. According to one implementation, the first 422a and second 422b transistors of the gain stage architecture are a p-channel Metal-Oxide-Semiconductor (PMOS) differential transistors.

According to other implementations, the first 422a and second 422b transistors of the gain stage architecture are p-channel Metal-Oxide-Semiconductor (PMOS) transistors. According to various features, PMOS transistors have a common mode of voltage output $V_{outp}$ and $V_{outm}$ that is close to zero. In general, PMOS transistors can handle a lower common mode voltage. According to some implementations, the buffers 410a and 410b of the first 450a and second 450b integrated Sallen-Key filters are implemented using PMOS source followers.

In some examples, the first 422a and second 422b transistors have a resistor 424a, 424b load Road. In some examples, one or more of the resistors 424a, 424b are replaced with transistors. In some examples, one or both of the resistors 424a, 424b are replaced with PMOS or NMOS transistors. In other examples, the first 422a and second 422b transistors have a PMOS/NMOS load. In some examples, the first 422a and second 422b transistors of the gain stage architecture are a p-channel/n-channel Metal-Oxide-Semiconductor (PMOS/NMOS) differential transistor pair.

In various implementations, the gain stage of the Sallen-Key filter can be implemented as one of a multiple stage or a single stage block.

An expression for $\omega_{3dB}$, the corner frequency of the filter, from Equation (3) above is shown below in Equation (4):

$$\omega_{3dB} = \frac{1}{RC_1\sqrt{2m\alpha + m}} \quad (4)$$

$\omega_{3dB}$ can be maintained at a constant value over PVT (process, voltage, temperature) by varying the capacitances $C_1$ and $C_2$ of the first 408a, 408b and second 418a, 418b capacitors, and keeping m constant. In some examples, $\omega_{3dB}$ is a 3 dB corner frequency of the filter. Similarly, an expression of Q can be obtained using Equation (5):

$$Q = \frac{\sqrt{2m\alpha + m}}{2 + m + m\alpha - mA} \quad (5)$$

Q can be maintained constant over PVT by keeping A constant. A is obtained by having the $g_m$ of the gain stage inversely proportional to $R_{load}$. In one example, the gain stage is implemented using circuits having a constant $g_m$. Similarly $R_{out}/R$ can be maintained constant by using a constant $g_m$ topology for the source follower. According to various implementations, using a differential gain stage alleviates a lot of common mode issues including second harmonic distortion (HD2).

According to some implementations, the source followers 410a and 410b are eliminated from FIG. 4. Thus, the buffer stage is eliminated from the Sallen-Key filter 400. Thus, the buffer is converted to a gain stage. However, according to some examples, eliminating the buffer stage exposes $R_{load}$ in the feedback path and creates a low frequency zero in conjunction with $C_2$. Thus, including even a low power buffer prevents the feedback path exposure of $R_{load}$ and also prevents the creation of a low frequency zero in conjunction with $C_2$. In various examples, a low power buffer 410a, 410b is included in the circuit, along with a relatively high $R_{out}$ at resistors 412a, 412b.

According to various implementation, the buffer 410a, 410b, can be implemented as a PMOS source follower, and NMOS source follower, or an operational amplifier (opamp)-based buffer.

According to further implementations, the output of the Sallen-Key filter can be taken at the input of the differential pair, or the output of the Sallen-Key filter can be taken at the input/output of the buffer 410a, 410b, and Equation (3), modified to have a conjugate zero in the numerator, is the transfer function. Alternatively, the output of the Sallen-Key filter can be taken at the input of the differential pair, or the output of the Sallen-Key filter can be taken at the input/output of the buffer 410a, 410b, and Equation (1) is the transfer function.

According to various implementations, the gain A can be derived as a function of m and α. For an ideal Butterworth Q=1/√2. Equating this value to equation (5) results in Equation (6):

$$A^2 - 2\beta A + \gamma = 0 \qquad (6)$$

where $$\beta = 1 + \alpha + \frac{2}{m} \text{ and } \gamma = 1 + \alpha^2 + 2\alpha + \frac{2}{m} + \frac{4}{m^2}$$

In one example, m=1 (implying an area reduction by ⅓), α=0.5, and A=1.5. Using these values, only a small amount of gain is required from the $g_m$ stage. Furthermore:

$$\sqrt{\beta^2 - \gamma} > 0 \qquad (7)$$

Equation (7) indicates that it is possible to get values of A for arbitrary low values of m and arbitrary high values of a, only to be limited by distortion and power consumed from $g_m$ stage at higher gains.

Figure 5:
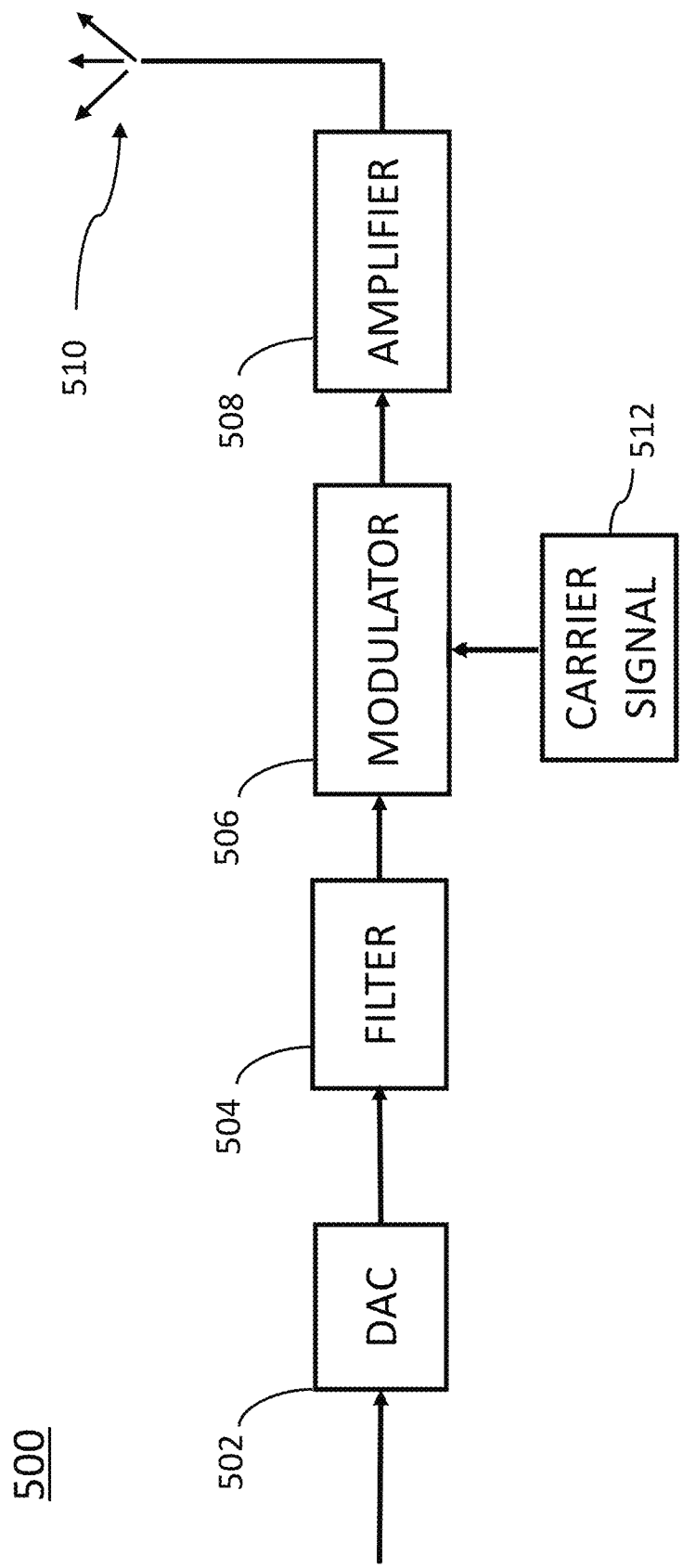
FIG. 5 is a diagram illustrating a transmitter including a Sallen-Key filter, according to some embodiments of the disclosure.

FIG. 5 is a diagram illustrating a transmitter 500 including a Sallen-Key filter, according to some embodiments of the disclosure. The transmitter 500 includes a digital-to-analog converter (DAC) 502, a Sallen-Key filter 504, a modulator 506, an amplifier 508, an antenna 510, and a carrier signal 512. According to various implementations, an input signal is input to the pre-amplifier, where it is amplified and input to the filter 504. The Sallen-Key filter 504 is the Sallen-Key filter 300 described with respect to FIG. 3. The filter 504 filters the signal, and then outputs it to a modulator 506. The modulator 506 combines the signal from the filter 504 with a carrier signal 512. The output from the modulator 506 is input to an amplifier 508, and the amplified signal from the amplifier 508 is transmitted via the antenna 510.

Figure 6:
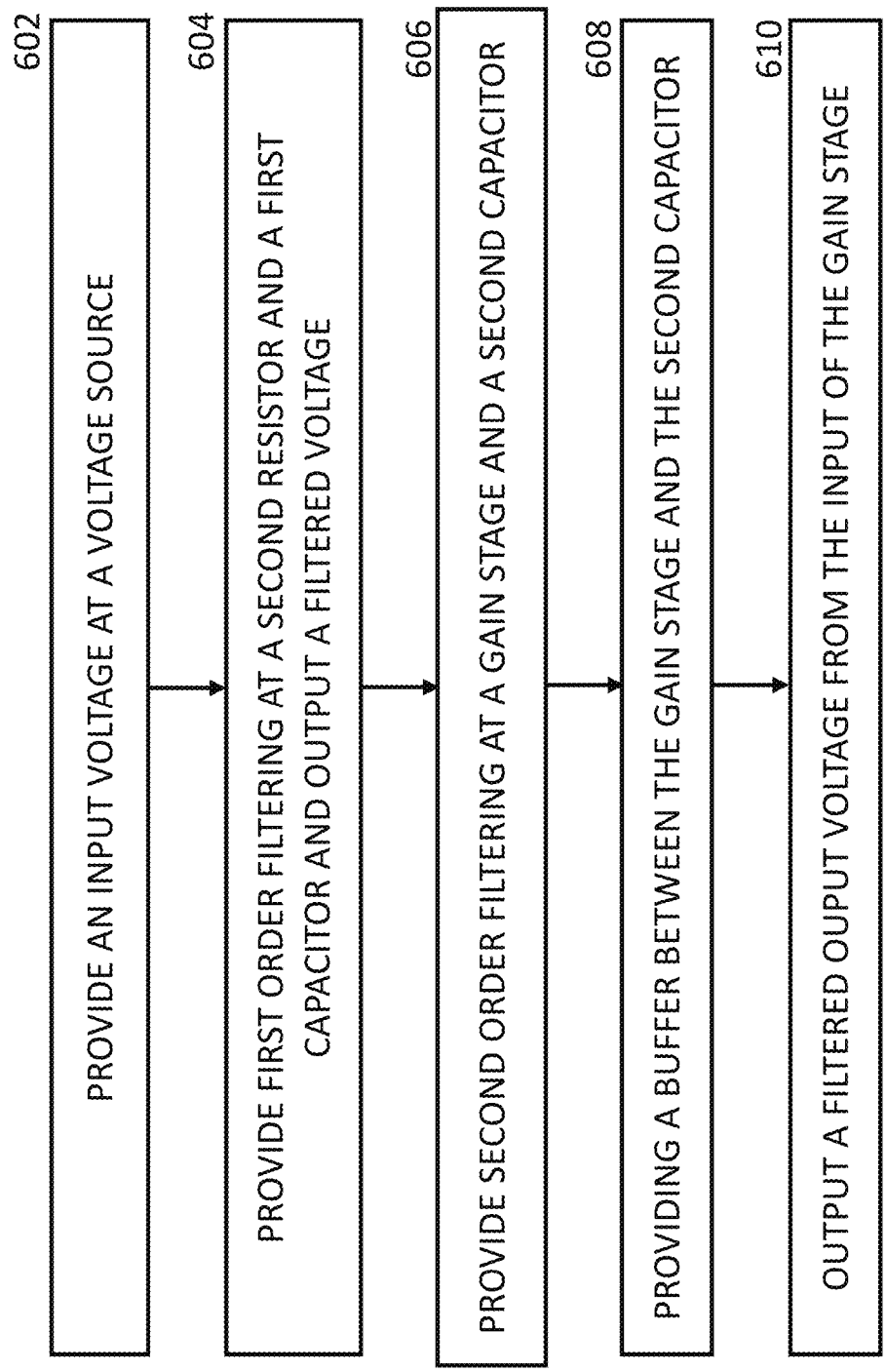
FIG. 6 is a flow chart illustrating a method for filtering a signal, according to some embodiments of the disclosure.

FIG. 6 is a flow chart showing a method 600 for filtering a voltage signal with a Sallen-Key filter, according to some embodiments of the invention. At step 602, an input voltage is provided at a voltage source. The input voltage passes through a first resistor. At step 604, first order filtering is performed at a second resistor and first capacitor and the filtered voltage is output. At step 606, second order filtering is performed at a gain stage and second capacitor. The gain stage and the second capacitor are provided between the output from the first order filtering and a connection point between the first and second resistors. The gain stage and second capacitor are designed to provide second order filtering with adequate quality factor. At step 608, a buffer is provided between the second capacitor and the gain stage. The buffer isolates and reduces the impact of the second capacitor loading on the gain stage. At step 610, a filtered output voltage is output from the input of the gain stage.

VARIATIONS AND IMPLEMENTATIONS

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the clocking and filtering functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that use sampled analog, some of which may be associated with processing real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to clocking in sampled analog systems, illustrate only some of the possible clocking functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A voltage-controlled, voltage source-based filter for providing a flat passband gain response, comprising:
    a voltage source configured to provide input voltage;
    a first resistor and a second resistor connected in series, wherein the first resistor is connected to the voltage source and a first side of the second resistor;
    a gain stage, wherein an input side of the gain stage is connected to a second side of the second resistor, wherein an output side of the gain stage connects back to a point between the first and second resistors creating a feedback path, wherein the gain stage is configured to introduce a gain to a feedback path voltage, and wherein the gain increases feedback of the feedback path;
    a third resistor, wherein a first side of the third resistor is connected to the output side of the gain stage and a second side of the third resistor is connected to ground; and
    an output connected to the gain stage configured to provide output voltage.

2. The filter of claim 1, wherein the gain stage comprises a transistor.

3. The filter of claim 2, wherein the transistor is a p-channel metal oxide semiconductor transistor.

4. The filter of claim 2, further comprising a second transistor, wherein the second transistor is one of a p-channel metal oxide semiconductor transistor and an n-channel metal oxide semiconductor transistor.

5. The filter of claim 2, wherein the first side of the third resistor is connected to the transistor drain.

6. The filter of claim 1, further comprising a buffer configured to buffer the feedback path voltage, wherein the buffer is one of a source follower and a transistor.

7. The filter of claim 1, wherein the gain stage operates as a buffer in the feedback path.

8. The filter of claim 1, further comprising a first capacitor connected to the input of the gain stage and a second capacitor after the output of the gain stage,
    wherein the first capacitor has a first capacitance,
    wherein the second capacitor has a second capacitance, and
    wherein a ratio of the first capacitance to the second capacitance is about one or less than one.

9. The filter of claim 1, wherein the output is an output line from the input side of the gain stage, wherein the output line provides the output voltage.

10. The filter of claim 1, wherein the gain of the gain stage is about 1.5 or less than 1.5.

11. A method for providing a flat gain response in a voltage-controlled, voltage source filter, comprising:
    providing an input voltage at a voltage source;
    filtering the input voltage at a second resistor and a first capacitor, and outputting a filtered signal;
    providing second order filtering of the filtered signal at a gain stage and a second capacitor, wherein an output side of the gain stage is connected to a third resistor, and wherein the gain stage increases gain of the filtered signal;
    providing a buffer between the gain stage and the second capacitor; and
    outputting a filtered output voltage from an input side of the gain stage.

12. The method of claim 11, further comprising providing a first resistor, wherein the first resistor is connected to the voltage source and the second resistor.

13. The method of claim 12, wherein the second resistor and the first capacitor comprise a first order filter, and wherein the gain stage and the second capacitor are connected between the first order filter and a connection point between the first and second resistors.

14. The method of claim 11, wherein providing the buffer comprises buffering a gain stage output with a source follower.

15. A voltage-controlled, voltage source-based filter for providing a flat passband gain response, comprising:
    a voltage source configured to provide input voltage;
    a first resistor connected to the voltage source;
    a first order filter including a second resistor and a first capacitor, wherein the second resistor is connected to the first resistor, and wherein the first order filter outputs a filtered signal;
    means for introducing a gain to the filtered signal;
    a third resistor, wherein a first side of the third resistor is connected to an output side of the means for introducing a gain and a second side of the third resistor is connected to ground; and
    an output line from an input side of the means for introducing the gain, wherein the output line is configured to provide a filtered output voltage.

16. The filter of claim 15, wherein the power consumption of the filter is between around 5 mW and around 6 mW.

17. The filter of claim 15, wherein the means for introducing the gain includes a gain stage, and the gain stage is further connected to a second capacitor.

18. The filter of claim 15, wherein the means for introducing the gain includes a transistor.

19. The filter of claim 18, wherein the transistor is a p-channel metal oxide semiconductor transistor.

20. The filter of claim 15, wherein the means for introducing the gain introduces a gain of about 1.5 or less than 1.5.

* * * * *